(12) United States Patent
De Graaf et al.

(10) Patent No.: US 8,338,846 B2
(45) Date of Patent: Dec. 25, 2012

(54) WAVELENGTH CONVERTED LIGHT EMITTING DIODE WITH REDUCED EMISSION OF UNCONVERTED LIGHT

(75) Inventors: Jan De Graaf, Eindhoven (NL); Martinus Petrus Joseph Peeters, Eindhoven (NL); Elvira Johanna Maria Paulussen, Eindhoven (NL); Daniel Anton Benoy, Eindhoven (NL); Marcellus Jacobus Johannes Van Der Lubbe, Eindhoven (NL); George Hubert Borel, Venlo (NL); Mark Eduard Johan Sipkes, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 14 days.

(21) Appl. No.: 12/999,706

(22) PCT Filed: Jun. 24, 2009

(86) PCT No.: PCT/IB2009/052713
§ 371 (c)(1),
(2), (4) Date: Dec. 17, 2010

(87) PCT Pub. No.: WO2010/001306
PCT Pub. Date: Jan. 7, 2010

(65) Prior Publication Data
US 2011/0084302 A1    Apr. 14, 2011

(30) Foreign Application Priority Data

Jul. 1, 2008  (EP) .................................... 08159397

(51) Int. Cl.
*H01L 33/50* (2010.01)
*H01L 33/00* (2010.01)
(52) U.S. Cl. ............. 257/98; 257/E33.06; 257/E33.067; 438/29
(58) Field of Classification Search ............ 257/98–101, 257/E33.06, E33.067; 438/29
See application file for complete search history.

(56) References Cited

U.S. PATENT DOCUMENTS

| 6,635,363 | B1 | 10/2003 | Duclos et al. |
| 6,642,618 | B2 | 11/2003 | Yagi et al. |
| 6,747,406 | B1 | 6/2004 | Bortscheller et al. |
| 7,053,419 | B1 | 5/2006 | Camras et al. |
| 7,064,355 | B2 | 6/2006 | Camras et al. |
| 2006/0202223 | A1 | 9/2006 | Sackrison et al. |
| 2006/0258028 | A1 | 11/2006 | Paolini et al. |
| 2007/0284600 | A1 | 12/2007 | Shchekin et al. |

FOREIGN PATENT DOCUMENTS

| WO | 2007085977 A1 | 8/2007 |
| WO | 2007144809 A1 | 12/2007 |

*Primary Examiner* — Benjamin Sandvik
*Assistant Examiner* — Whitney T Moore
(74) *Attorney, Agent, or Firm* — Mark L. Beloborodov

(57) ABSTRACT

A method for the manufacture of a wavelength converted light emitting device is provided. A light curable coating material is arranged on the outer surface of a wavelength converted light emitting diode. The light curable coating material is cured, in positions where a high intensity of unconverted LED-light encounters the curable coating material. The method can be used to selectively stop unconverted light from exiting the device, leading to a wavelength converted LED essentially only emitting converted light.

15 Claims, 2 Drawing Sheets

WAVELENGTH CONVERTED LIGHT EMITTING DIODE WITH REDUCED EMISSION OF UNCONVERTED LIGHT

FIELD OF THE INVENTION

The present invention relates to a light emitting device, comprising a wavelength converted light emitting diode that comprises a light emitting diode having a light emitting surface on which surface is arranged a self-supporting wavelength converting body, adapted to receive light emitted by said light emitting diode and convert at least part of said light into light of a different wavelength. The present invention also relates to methods for the manufacture of such devices.

BACKGROUND OF THE INVENTION

Light emitting diodes (LEDs) are emerging as light sources for many applications.

By application of wavelength converting materials, such a fluorescent and/or luminescent materials, in the path of light, the emitted wavelength can be adapted to many specific wavelengths. Blue and/or UV-light emitting LEDs are especially suitable as the light source in such light emitting diodes (hereinafter referred to wavelength converted light emitting diodes) due to that the wavelength converting materials typically absorbs at least part of the light emitted by the diode and emits light having a higher wavelength (a red-shift).

The wavelength converting material may be adapted to absorb essentially all light emitted by the LED (often referred to as pump-light) so that only light of the converted wavelength is output from the device. In other wavelength converting LEDs, the wavelength converting material is adapted to only absorb and convert a portion of the pump-light, so that the total output is a mixture of converted and unconverted light. For example, a partial conversion of blue light into yellow light results in a whitish total output.

One example of such a wavelength converted LED is described in WO 2007/085977 A1, to Koninklijke Philips Electronics N.V., where a plate of a ceramic conversion element is arranged on a LED-chip for conversion of part of the light emitted by the LED-chip.

However, the degree of conversion of the pump light is a factor of the distance of the light path through the wavelength converting material. Especially at the edges of the wavelength converting material, this may cause problems. At the edges, pump light have an opportunity to exit the device only after a short passage through the wavelength converting material, leading to a lower degree of conversion at these edges. This can often be seen as a ring of unconverted light surrounding the converted light.

Some wavelength converting diodes rely on self-supporting, such as ceramic, wavelength converting bodies that are bonded onto the light emitting surface of the LED-chip by means of a bonding material. In such diodes, the bonding material forms a spacing between the wavelength converting body and the diode, and by nature, the glue must be transmissive to the pump light emitted by the LED-chip. In such devices, some pump light is prone to exit the device via the lateral surfaces of the bonding material, once again resulting in a ring of unconverted light surrounding the converted light.

Especially in devices where full conversion of the light is wanted, this ring-effect is much unwanted as it calls for absorptive filters to remove output unconverted light.

SUMMARY OF THE INVENTION

It is an object of the present invention to overcome this problem, and to provide a wavelength-converted light emitting diode with reduced ring-effect, which is easy to manufacture.

The present inventors have realized that a wavelength converted light emitting diode with reduced leakage of unconverted light can be obtained by using a light curable coating material that cures upon being illuminated by unconverted light. In cured state, the coating material forms an essentially light blocking material, such as highly scattering, absorptive or reflecting material. The curable coating material can be applied on regions of a wavelength converted light emitting diode where unconverted light has been shown or is supposed to leak out from the device, where after the coating material is cured, and excess, uncured material can be washed away.

Hence, in a first aspect, the present invention relate to a method for the manufacture of a wavelength converted light emitting device comprising: providing a light emitting diode for emitting light of a first wavelength, having a light emitting surface on which surface is arranged a wavelength converting material, adapted to receive light emitted by said light emitting diode and convert at least part of said received light into light of a second wavelength; arranging, on at least part of the outer surface of said wavelength converted light emitting device, a light curable coating material where illumination by light of said first wavelength of an effective intensity induces curing of said light curable coating material; curing at least part of said light curable coating material by illuminating said material utilizing said light emitting diode, to form a cured, light blocking material.

Typically, the light blocking material is selected from the group of scattering, absorbing and reflective materials.

The inventive method is advantageous in that the light curable material only cures at positions on the outer surface of the wavelength converted LED where high amounts of unconverted light reaches the outer surface. Due to the scattering, absorbing or reflective action of the cured material, unconverted light is to a large extent prevented from exiting the device.

A reflective coating material is preferred as the unconverted light is then reflected back into the device, being provided with a new opportunity to become converted. Hence, a reflective coating material thus increases the light utilization efficiency of the device, since a higher percentage of the light emitted by the LED is converted.

Using light emitted by the LED of the device for curing the curable coating material ensures that the coating material is only cured in positions on the outer surface of the device where the intensity of unconverted light is strong enough to effect curing.

In embodiments of the invention, the method further comprises the step of removing uncured coating material.

The step of removing uncured material after the step of curing by illumination ensures that the coating material is only present in those locations of the device where unconverted light would exit the device. Hence, the coating material is essentially only present where necessary, not unintentionally obstructing converted light from exiting the device.

In embodiments of the present invention, the wavelength converting material may be contained in a self-supporting wavelength converting body.

By incorporating the wavelength converting material in a self supporting body, the thickness of the wavelength converting material can be accurately controlled, such as by grinding the self supporting body to a desired thickness.

In embodiments of the present invention such self-supporting wavelength converting body may be arranged on said light emitting diode by means of a light transmissive bonding layer, and wherein said light curable coating material is arranged on the lateral surface of said bonding material.

In certain types of wavelength converted LEDs, the wavelength converted body is bonded to the LED by means of a transmissive bonding material. This bonding material typically results in a spacing between the LED and the wavelength converting body. The lateral edges of the bonding material thus forms a window through which unconverted light readily can exit the device. To prevent the leakage of unconverted light through the lateral edge of the bonding material, it is clearly advantageous to arrange the curable coating material on this lateral edge, followed by curing the coating material.

In embodiments of the present invention, the light curable coating material is selected from the group consisting of epoxies and polyvinyl alcohols. Other light curable materials are known to those skilled in the art.

In embodiments of the present invention, the light curable coating material may be essentially non-reactive to light converted by said wavelength converting material.

It is advantageous if the light curable coating material essentially is non-reactive to the converted light, or otherwise, the coating material might become cured in non-desired positions.

In a second aspect, the present invention comprises a wavelength converted light emitting device, comprising a light emitting diode for emitting light of a first wavelength, having a light emitting surface, on which surface is arranged a wavelength converting material, adapted to receive at least part of the light emitted by said light emitting diode and convert at least part of said light into light of a second wavelength, wherein at least part of the outer surface of said device is provided with a light curable coating material that cures upon illumination by light of said first wavelength, and which light curable coating material, in cured state, provides a material selected from the group of scattering, absorbing and reflective materials.

This aspect of the present invention relates an intermediate product, i.e. the device after having applied the curable coating material but before curing the same.

In a third aspect, the present invention relates to a wavelength converted light emitting device, comprising a light emitting diode having a light emitting surface on which surface is arranged a wavelength converting material, adapted to receive at least part of the light emitted by said light emitting diode and convert at least part of said light into light of a different wavelength, wherein a cured coating material, selected from the group of scattering, absorbing and reflective materials, is selectively arranged in certain locations on the outer surface of said device, and said certain locations being selected among positions where light of said first wavelength encounters said lateral edge.

This aspect of the present invention relates to the final product, i.e. the device after having cured the curable coating composition.

It is further to be noted that the present invention relates to all possible combinations of the claims.

BRIEF DESCRIPTION OF THE DRAWINGS

These and other aspects of the present invention will now be described in more detail, with reference to the appended drawings showing a currently preferred embodiment of the invention.

DETAILED DESCRIPTION

Figure 1:
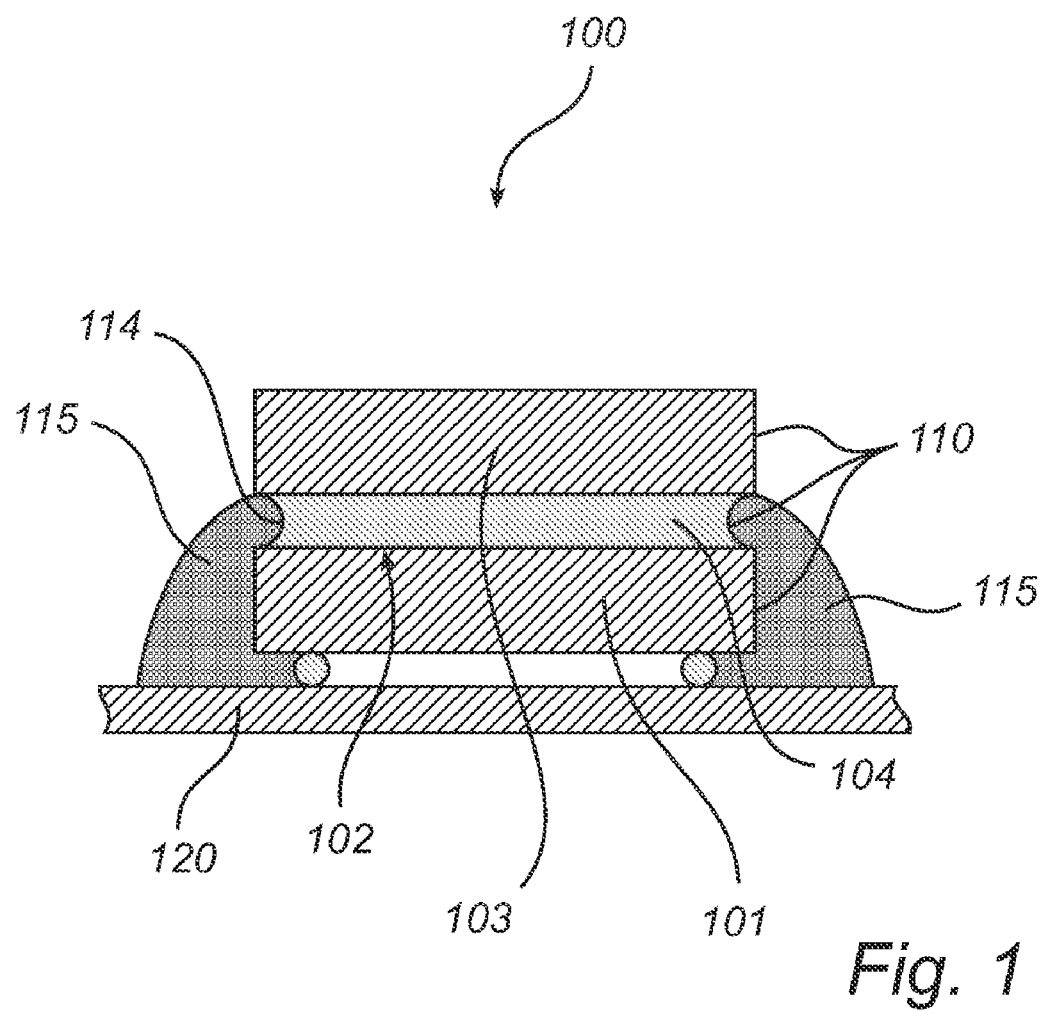
FIG. 1 illustrates a wavelength converted device of the present invention.

An illustrative embodiment of a device of the present invention is illustrated in FIG. 1. The wavelength converted device 100 of this embodiment comprises a light emitting diode (LED) chip 101 having a light upwards facing light emitting surface 102. A self-supporting wavelength converting body 103 is optically and physically bonded to the light emitting surface 102 of the diode 101 by means of a transmissive bonding material 104.

The light emitting diode 101 emits light, mainly through its light emitting surface, of a first wavelength (or a first wavelength interval with a first peak intensity).

The wavelength converting body 103 is adapted to receive and absorb at least part of the light emitted by the diode 101 and to convert the absorbed light into light of a second, higher wavelength (or a second wavelength interval with a peak intensity at a higher wavelength). The wavelength conversion is due to wavelength converting materials, such as fluorescent and/or phosphorescent materials contained in the wavelength converting body.

The wavelength converted device 100 is typically arranged on a substrate 120 and the LED chip 101 is typically connected to conductive lines (not shown) for driving the LED chip.

The degree of wavelength conversion is a factor of the length of the path through the light wavelength converting body 103. Hence, in certain positions on the outer surface 110 of the device, where the path of light through the wavelength converting body 103 is short, or where unconverted light is capable of reaching the outer surface without passing the wavelength converting body, such as the lateral edge 114 of the bonding material 104, the intensity of unconverted light, i.e. light if the first wavelength, will reach this outer surface.

To prevent unconverted light with high intensity to exit the device, a coating material is arranged at such positions where the unconverted light otherwise would have exited the device.

Typically, such positions includes the lateral edge 114 of the transmissive bonding material and the lateral edge of the LED chip 101.

As is used herein, a light emitting diode or LED refers to any type of light emitting diode known to those skilled in the art, and includes conventional inorganic based LEDs, as well as organic based LEDs (OLEDs) and polymeric based LEDs.

The LED chip is preferably of the "flip-chip" type where both leads are positioned on the same side of the chip. This design facilitates the arrangement of the wavelength converting body on the light emitting surface of the device. However, also other types of LED chips are contemplated for use in the present invention.

The LEDs for use in the present invention may emit light of any color, from the UV range, over the visible range, to the IR range. However, since wavelength converting materials conventionally converts light by a red shift, it is often desired to use a LED emitting light in the UV/blue range, since such light can be converted into essentially any other color.

The wavelength converting material for use in the present invention is preferably a fluorescent and/or phosphorescent material, which becomes excited by unconverted light and emits light upon relaxation.

In a presently preferred embodiment, the wavelength converting body is shaped into a self-supporting wavelength converting body comprising or consisting of the wavelength converting material.

In one embodiment the self-supporting wavelength converting body may be comprise a pressed ceramic material of essentially wavelength converting material or a dimensionally stable matrix material, such as but not limited to, PMMA (polymethylmethacrylate) or other materials that can be doped with particles and have embedded wavelength converting particles. In another embodiment, the self-supporting wavelength converting body may comprise a ceramic material having a density of more than 97% of the theoretical solid-state density.

Examples of phosphors that may be formed into luminescent ceramic layers include aluminum garnet phosphors with the general formula $(Lu_{1-x-y-a-b}Y_xGd_y)_3(Al_{1-z}Ga_z)_5O_{12}$:$Ce_aPr_b$, wherein $0<x<1$, $0<y<1$, $0<z\leq0.1$, $0<a\leq0.2$ and $0<b\leq0.1$, such as $Lu_3Al_5O_{12}$:$Ce^{3+}$ and $Y_3Al_5O_{12}$:$Ce^{3+}$ which emit light in the yellow-green range; and $(Sr_{1-x-y}Ba_xCa_y)_{2-z}Si_{5-a}Al_aN_{8-a}O_a$:$Eu_z^{2+}$ wherein $0\leq a<5$, $0<x\leq1$, $0\leq y\leq1$, and $0<z\leq1$, such as $Sr_2Si_5N_8$:$Eu^{2+}$, which emit light in the red range. Suitable $Y_3Al_5O_{12}$:$Ce^{3+}$ ceramic slabs may be purchased from Baikowski International Corporation of Charlotte, N.C. Other green, yellow, and red emitting phosphors may also be suitable, including $(Sr_{1-a-b}Ca_bBa_c)Si_{x-}N_yO_z$:$Eu_a^{2+}$ (a=0.002-0.2, b=0.0-0.25, c=0.0-0.25, x=1.5-2.5, y=1.5-2.5, 2=1.5-2.5) including, for example, $SrSi_2N_2O_2$:$Eu^2$; $(Sr_{1-u-v-x}Mg_uCa_vBa_x)(Ga_{2-y-z}Al_yIn_zS_4)$:$Eu^{2+}$ including, for example, $SrGa_2S_4$:$EU^{2+}$; $Sr_{1-x}Ba_xSiO_4$:$EU^{2+}$; and $(Ca_{1-x}Sr_x)S$:$Eu^{2+}$ wherein $0<x\leq1$ including, for example, $CaS$:$Eu^{2+}$ and $SrS$:$Eu^{2+}$.

The self supporting wavelength converting body is typically shaped into a flat plate or a dome shaped body (having a flat surface towards the LED), or any other shape that might suite the application of the device. A flat plate shaped wavelength converting body for use in the present invention typically has a thickness of from 10 to 1000 µm, such as about 100 to 500 µm, for example around 250 µm.

The bonding material for use when optically and physically bonding a self supporting wavelength converting body to an LED is preferably essentially transmissive, at least for unconverted light of the first wavelength.

Examples of bonding materials that are suitable for use depends on the application, the material of the light emitting surface of the LED, the material of the wavelength converting body and on the temperatures to which the bonding material is to be exposed.

Examples of bonding materials include for example low-melting glass, epoxy materials, transmissive polymers and siloxanes, such as PDMS.

Luminescent ceramic layers may be attached to light emitting devices by, for example, wafer bonding, sintering, gluing with thin layers of known organic adhesives such as epoxy or silicone, gluing with high index inorganic adhesives, and gluing with sol-gel glasses.

Examples of high index adhesives include high index optical glasses such Schott glass SF59, Schott glass LaSF 3, Schott glass LaSF N18, and mixtures thereof. These glasses often have an index of refraction greater than 1.8 and are available from Schott Glass Technologies Incorporated, of Duryea, Pa. Examples of other high index adhesives include high index chalcogenide glass, such as (Ge,Sb,Ga)(S,Se) chalcogenide glasses, III-V semiconductors including but not limited to GaP, InGaP, GaAs, and GaN, II-VI semiconductors including but not limited to ZnS, ZnSe, ZnTe, CdS, CdSe, and CdTe, group IV semiconductors and compounds including but not limited to Si and Ge, organic semiconductors, metal oxides including but not limited to tungsten oxide, titanium oxide, nickel oxide, zirconium oxide, indium tin oxide, and chromium oxide, metal fluorides including but not limited to magnesium fluoride and calcium fluoride, metals including but not limited to Zn, In, Mg, and Sn, yttrium aluminum garnet (YAG), phosphide compounds, arsenide compounds, antimonide compounds, nitride compounds, high index organic compounds, and mixtures or alloys thereof. Gluing with high index inorganic adhesives is described in more detail in application Ser. No. 09/660,317, filed Sep. 12, 2000, and Ser. No. 09/880,204, filed Jun. 12, 2001, both of which are incorporated herein by reference.

Gluing with sol-gel glasses is described in more detail in U.S. Pat. No. 6,642,618, which is incorporated herein by reference. In embodiments where the luminescent ceramic is attached to the device by a sol-gel glass, one or more materials such as oxides of titanium, cerium, lead, gallium, bismuth, cadmium, zinc, barium, or aluminum may be included in the $SiO_2$ sol-gel glass to increase the index of refraction of the glass in order to more closely match the index of the glass with the indices of the luminescent ceramic and the light emitting device. For example, a $Y_3Al_5O_{12}$:$Ce^{3+}$ ceramic layer may have an index of refraction of between about 1.75 and 1.8, and may be attached to a sapphire growth substrate of a semiconductor light emitting device, which sapphire substrate has an index of refraction of about 1.8. It is desirable to match the refractive index of the adhesive to the refractive indices of the $Y_3Al_5O_{12}$:$Ce^{3+}$ ceramic layer and the sapphire growth substrate.

The coating material for use in the present invention is a light curable coating material that upon curing forms a light blocking, typically a scattering, absorbing or reflecting material. As used herein, "light blocking material" refers to a material that blocks at least a major part, such as >80%, for example >95%, most preferably essentially 100% of the unconverted light from being transmitted through the light blocking material. There are many examples of material that can be used for this purpose.

Typically, scattering, absorbing or reflecting particles are dispersed in a curable medium, preferably having high viscosity.

For example, scattering particles, such as of metal oxides, reflective metal flakes and/or absorbing dyes or pigments may be dispersed in the curable medium.

When it comes to scattering particles, the concentration in the medium is typically high enough to form an essentially opaque coating upon curing.

For example $TiO_2$ particles, such as having sub-micrometer diameters, may be used as scattering particles.

The light curable coating material is adapted to cure locally upon illumination with light of an curing effective intensity of the first wavelength. It is further preferred that the light curable coating material is essentially non-reactive to illumination of light of the second, converted, wavelength. At least, it is preferred that the intensity of said second wavelength needed to effect curing of said coating material is higher than what normally can be achieved in the wavelength converted device of the present invention.

The curable medium of the light curable coating material typically comprises a polymerizable material, such as, but not limited to epoxies and polyvinyl alcohols. The polymerizable material may be intrinsically reactive upon, i.e. activated by, illumination by light of said first wavelength (i.e. unconverted light), or may alternatively or in addition comprise a light-inducible polymerization initiator.

In a typical embodiment, the light of the first wavelength is in the UV or blue wavelength range, and thus, light in this wavelength range, and above a certain intensity, should effect polymerization, while preferably light in the green, yellow and red wavelength ranges does not effect polymerization to any appreciable extent.

Preferably, the curing of the coating material should further be localized to illuminated areas, i.e. the initiation of curing should not start a chain reaction or the like that leads to full curing of the total coating material bulk. Alternatively, such chain reaction should, if it occurs, proceed slowly to allow removal of uncured material.

Octacat™, available from General Electric's Silicone products, Waterford, N.Y. (US) or FC530, available from 3M, and Dentsply's Prime and Bond, available from Dentsply Caulk, Inc, Milford (US) are non-limiting examples of such UV/blue-light curable coating materials.

FIG. 2, a-d, schematically illustrates a method according to the invention. FIG. 2a illustrates a wavelength converting light emitting device before the application of the light curable coating composition.

Figure 2A:
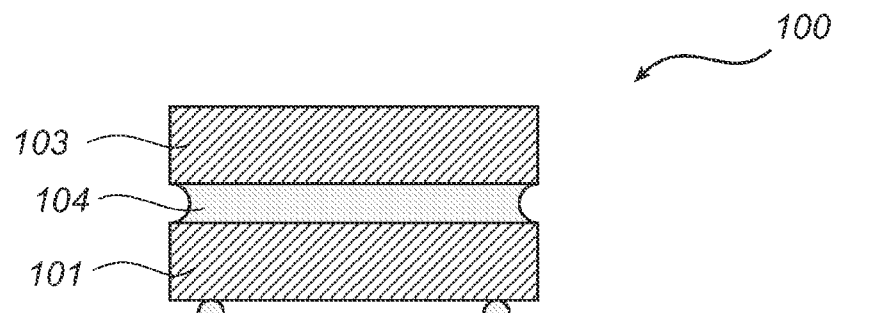
FIGS. 2 a-d illustrates in a flow chart a method of the invention for the manufacture of a wavelength converted device of the present invention.
Figure 2B:
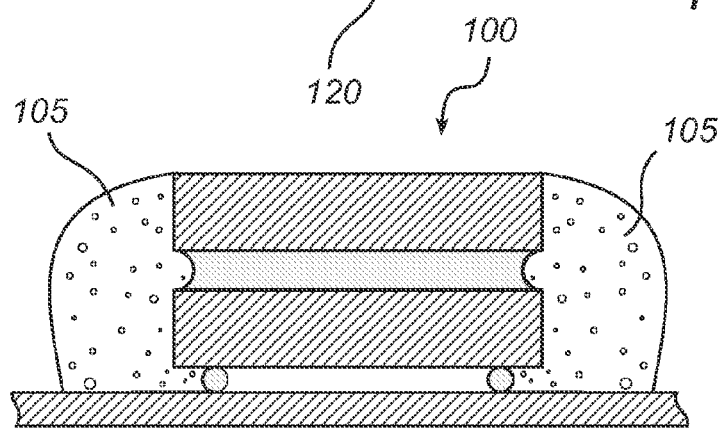

The light curable coating material 105 is typically applied on desired parts of the outer surface 110 of the wavelength converted device 100, such as on the lateral surface of the wavelength converting material, the lateral edge 114 of the bonding material 104 and the lateral surface of the LED chip 101. (FIG. 2b)

It should be noted that a wavelength converted device 100 on which the light curable coating material 105 is represents a contemplated aspect of the present invention.

Figure 2C:
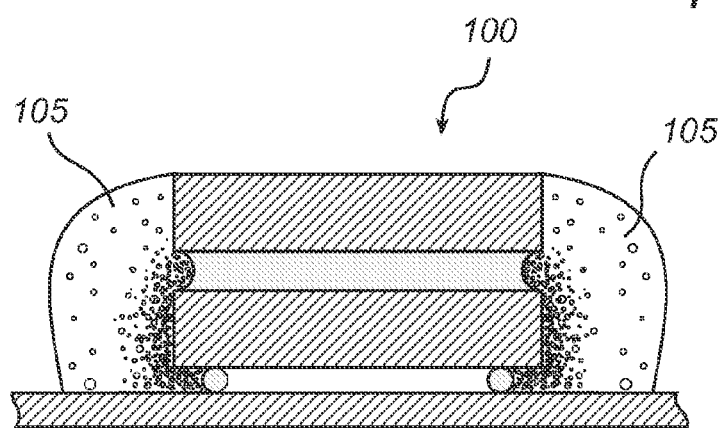

Thereafter, the LED chip 101 is activated, leading to an illumination and curing of the coating material 105 in positions where light of the first wavelength encounters the coating material 105 at an intensity strong enough to effect such curing, i.e an effective intensity. (FIG. 2c)

Figure 2D:
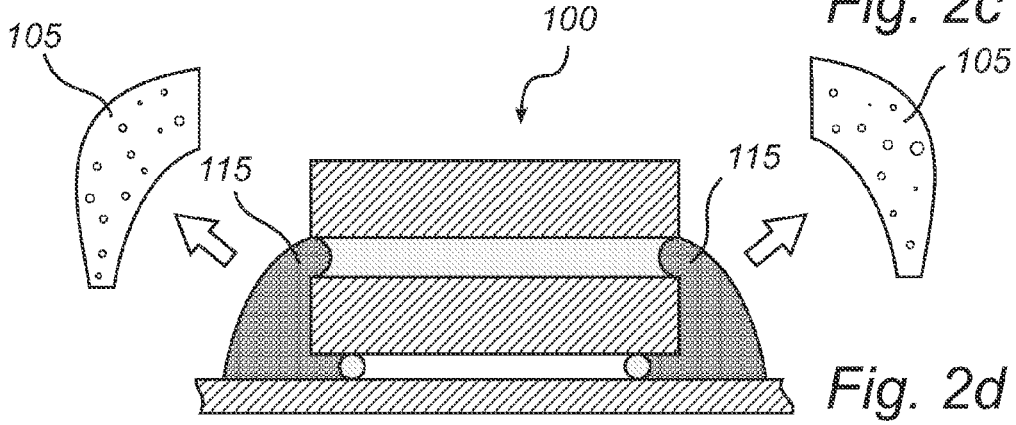

Finally, any uncured coating material 105 can be removed from the device, resulting in a wavelength converted light emitting device 100, where a cured, light blocking coating material (scattering, absorbing or reflecting) 115 is arranged at positions where unconverted light otherwise would have exited the device at a high intensity (FIG. 2d).

The person skilled in the art realizes that the present invention by no means is limited to the preferred embodiments described above. On the contrary, many modifications and variations are possible within the scope of the appended claims. For example, more than one, such as two or more, light emitting diodes may be bonded to one and the same self-supporting wavelength converting body. Further, is should be noted that even though the above description mainly refers to the wavelength converting material contained in a self-supporting wavelength converting body, the present invention is not limited to this, and the wavelength converting material may for example be spray deposited as a powder on the light emitting surface of the LED.

The invention claimed is:

1. A method for the manufacture of a wavelength converted light emitting device, comprising:
   providing a light emitting diode for emitting light of a first wavelength, having a light emitting surface on which surface is arranged a wavelength converting material, adapted to receive light emitted by said light emitting diode and convert at least part of said received light into light of a second wavelength;
   arranging, on at least part of the outer surface of said wavelength converted light emitting device, a light curable coating material where illumination by light of said first wavelength of an effective intensity induces curing of said light curable coating material; and
   curing at least part of said light curable coating material by illuminating said material utilizing said light emitting diode, to form a cured light blocking material.

2. A method according to claim 1, further comprising the step of removing uncured coating material.

3. A method according to claim 1, wherein said wavelength converting material is contained in a self-supporting wavelength converting body.

4. A method according to claim 3, wherein said self-supporting wavelength converting body is arranged on said light emitting diode by means of a light transmissive bonding layer, and wherein said light curable coating material is arranged on the lateral surface of said bonding material.

5. A method according to claim 1, wherein said light curable coating material is selected from the group consisting of epoxies and polyvinyl alcohols.

6. A method according to claim 1, wherein said light curable coating material is substantially non-reactive to light converted by said wavelength converting material.

7. The method of claim 1, further comprising arranging on a substrate a bottom surface of the wavelength converted light emitting device that is different from the outer surface.

8. A wavelength converted light emitting device, comprising:
   a light emitting diode for emitting light of a first wavelength, having a light emitting surface, on which surface is arranged a wavelength converting material, adapted to receive at least part of the light emitted by said light emitting diode and convert at least part of said light into light of a second wavelength,
   wherein at least part of an outer surface of said device is provided with a light curable coating material that is curable upon illumination by light of said first wavelength, and
   wherein the light curable coating material is substantially opaque in a cured state.

9. A wavelength converted light emitting diode according to claim 8, wherein said wavelength converting material is contained in a self-supporting wavelength converting body.

10. A wavelength converted light emitting device according to claim 9, wherein said wavelength converting body is arranged on said light emitting surface by means of a light transmissive bonding material, and wherein the lateral surface of said bonding material is provided with said light curable coating material.

11. The device of claim 8, wherein a bottom surface of the wavelength converted light emitting device that is different from the outer surface is disposed on a substrate.

12. A wavelength converted light emitting device, comprising:
   a light emitting diode having a light emitting surface on which surface is arranged a wavelength converting material, adapted to receive at least part of the light emitted by said light emitting diode and convert at least part of said light into light of a different wavelength,
   a substantially opaque cured coating material is selectively arranged in certain locations on an outer surface of said device, and
   said certain locations being selected among positions where light of said first wavelength encounters said outer surface.

13. A wavelength converted light emitting diode according to claim 12, wherein said wavelength converting material is contained in a self-supporting wavelength converting body.

14. A wavelength converted light emitting diode according to claim 13, wherein said self-supporting wavelength converting body is bonded to said light emitting diode by means of a light transmissive bonding material, the lateral surface of said bonding material being provided with said coating material.

15. The device of claim 12, wherein a bottom surface of the wavelength converted light emitting device that is different from the outer surface is disposed on a substrate.

* * * * *